(12) United States Patent
Wilke

(10) Patent No.: US 11,064,627 B2
(45) Date of Patent: Jul. 13, 2021

(54) MODULAR ADJUSTABLE COMPUTING RACK

(71) Applicant: Western Digital Technologies, Inc., San Jose, CA (US)

(72) Inventor: Jeffrey David Wilke, Palmer Lake, CO (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/457,187

(22) Filed: Jun. 28, 2019

(65) Prior Publication Data

US 2020/0413560 A1  Dec. 31, 2020

(51) Int. Cl.
| H05K 7/00 | (2006.01) |
| H05K 7/14 | (2006.01) |
| H05K 7/18 | (2006.01) |

(52) U.S. Cl.
CPC ............ *H05K 7/1489* (2013.01); *H05K 7/18* (2013.01)

(58) Field of Classification Search
None
See application file for complete search history.

(56) References Cited

U.S. PATENT DOCUMENTS

| 4,261,470 A | 4/1981 | Dolan |
| 6,185,098 B1 | 2/2001 | Benavides |
| 6,749,070 B2 | 6/2004 | Corbett et al. |
| 8,665,590 B2 | 3/2014 | Wang |
| 8,947,879 B2 | 2/2015 | Broome et al. |
| 9,699,935 B1 | 7/2017 | Marrs et al. |
| 9,814,155 B2* | 11/2017 | Cox ..................... H05K 7/1488 |
| 9,826,656 B2 | 11/2017 | Connor et al. |
| 9,845,727 B2 | 12/2017 | Suciu et al. |
| 10,219,400 B2 | 2/2019 | Klaba et al. |
| 2004/0183409 A1 | 9/2004 | Rinderer |
| 2008/0164794 A1 | 7/2008 | Lai et al. |

(Continued)

FOREIGN PATENT DOCUMENTS

| EP | 1229775 B1 | 6/2010 |
| JP | 2016111215 A | 6/2016 |

OTHER PUBLICATIONS

International Search Report and Written Opinion for counterpart PCT/US2019/068630, dated Apr. 26, 2020, 11 pages, ILPO.

(Continued)

*Primary Examiner* — Anthony Q Edwards
*Assistant Examiner* — Rashen E Morrison

(57) ABSTRACT

Various embodiments of the present technology generally relate to systems and methods for storing datacenter equipment. More specifically, some embodiments relate to a datacenter rack ("computing rack") that can be adjusted to fit various sizes of computing equipment and can be stacked with additional computing racks. In certain embodiments, the computing rack includes an enclosure for storing a plurality of computing units as well as one or more adjustable vertical mounting rails coupled to the frame of the computing rack for accommodating different sizes and specifications of equipment. The computing rack additionally includes components for stacking the unit with additional computing racks such that a set of stacked computing racks can fit multiple different sizes and specifications of computing equipment.

20 Claims, 11 Drawing Sheets

(56) References Cited

U.S. PATENT DOCUMENTS

| | | | |
|---|---|---|---|
| 2008/0231151 A1* | 9/2008 | Barringer | H05K 7/1495 312/223.2 |
| 2011/0194892 A1* | 8/2011 | Huang | F16B 7/185 403/296 |
| 2012/0007478 A1 | 1/2012 | Fan | |
| 2012/0301215 A1* | 11/2012 | Huang | A47B 47/0016 403/176 |
| 2013/0165035 A1* | 6/2013 | Krietzman | H05K 7/20745 454/184 |
| 2014/0263129 A1* | 9/2014 | Tseng | H05K 7/1488 211/182 |
| 2015/0090679 A1* | 4/2015 | Obernesser | A47B 47/0083 211/26 |
| 2015/0136714 A1* | 5/2015 | Franklin | H05K 7/183 211/26 |
| 2016/0128474 A1* | 5/2016 | Chen | A47B 88/969 312/333 |

OTHER PUBLICATIONS

John Niemann, Kevin Brown, and Victor Avelar, "Hot-Aisle vs. Cold-Aisle Containment for Data Centers", APC by Schneider Electric, White Paper 135 Revision 1, pp. 1-13, Schneider Electric, United States.

"19-inch rack", Wikipedia, May 28, 2019, Wikimedia Foundation, Inc., Online, https://en.wikipedia.org/wiki/19-inch_rack, accessed on Jun. 27, 2019.

"Rack Unit", Wikipedia, Jun. 1, 2019, Wikimedia Foundation, Inc., Online, https://en.wikipedia.org/wiki/Rack_unit, accessed on Jun. 27, 2019.

"Define: Rack Unit "U" or "RU"", The Server Rack FAQ, 2019, Innovation First, Inc., Online, https://www.server-racks.com/rack-unit-u-ru.html, accessed on Jun. 27, 2019.

https://www.cdw.com/product/StarTech.com-12U-Adjustable-Depth-Open-Frame-4-Post-Server-Rack/3537379?cm_cat=google&cm_ite=3537379&cm_pla=NA-NA-StarTech.com_RQ&cm_ven=acquirgy&ef_id=Cj0KCQjw6cHoBRDdARIsADiTTzZ1BEpaU-915jHDxg4DGPg-vk7QXPZtwAA0pO_eLkT8A9XRG0dK8AoaAv3PEALw_wcB:G:s&gclid=CjoKCQjw6cHoBRDdARIsADiTTzZ1BEpaU-915jHDxg4DGPg-vk7QXPZtwAA0pO_eLkT8A9XRG0dK8AoaAv3PEALw_wcB&s_kwcid=AL ! 4223 ! 3 ! 198550684965 ! ! ! g ! 302803872228 !.

* cited by examiner

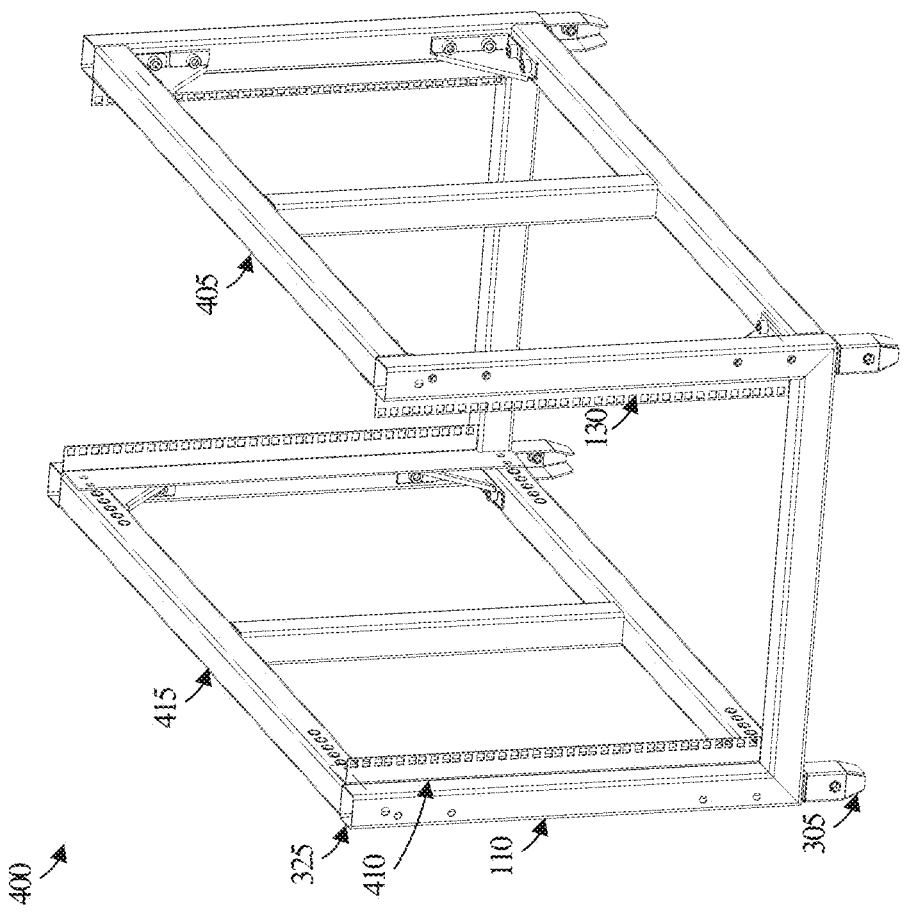

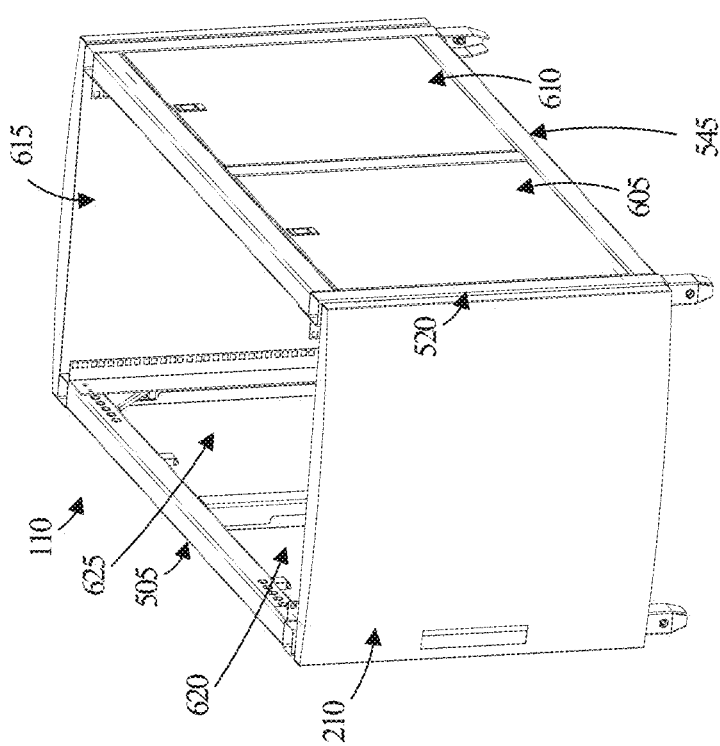

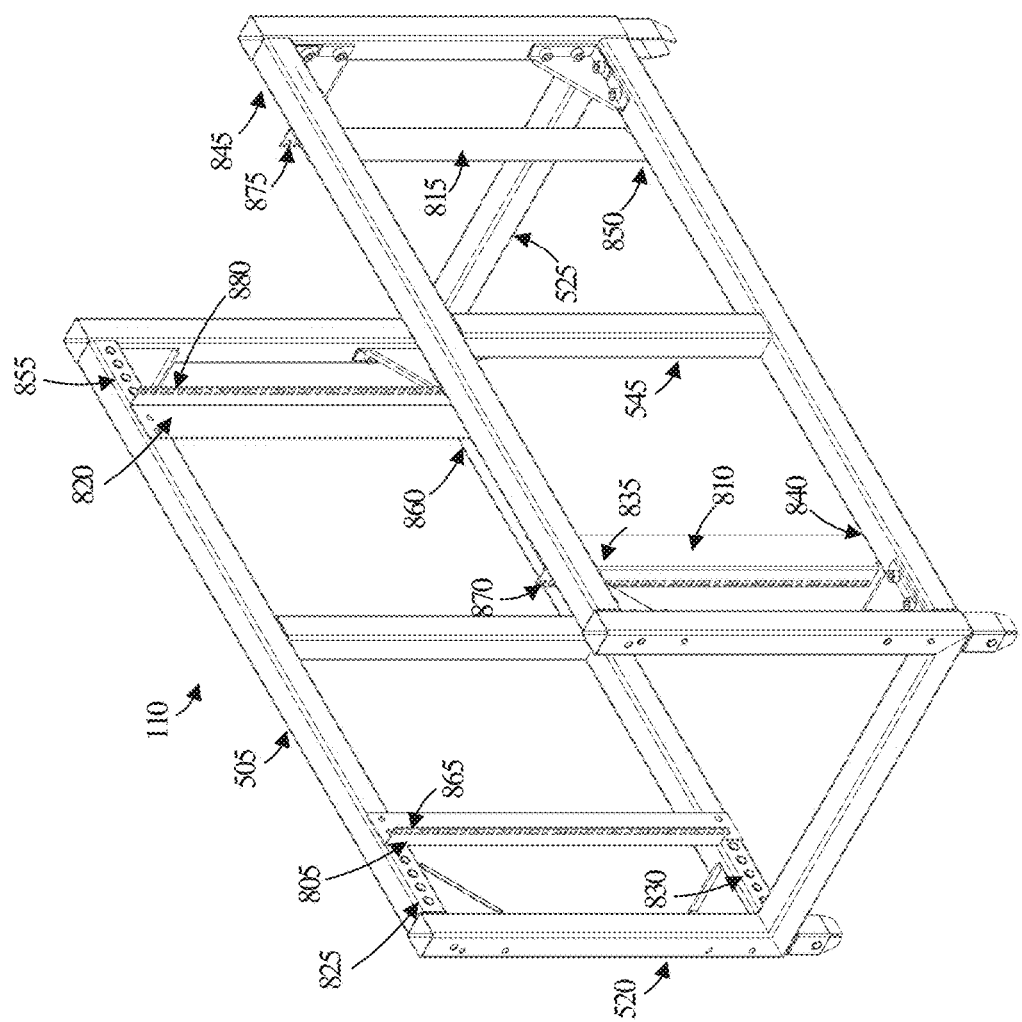

MODULAR ADJUSTABLE COMPUTING RACK

TECHNICAL FIELD

Various embodiments of the present technology generally relate to systems configured to store datacenter equipment. More specifically, embodiments of the present technology include a modular computing rack that is adjustable and can be stacked with additional modular computing racks in order to accommodate a variety of types and sizes of computing equipment.

BACKGROUND

As computer systems and networks grow in numbers and capability, there is a growing need for network, storage, and compute technology resources. Cloud computing and large-scale data processing systems have further increased the need for network, storage, and compute systems capable of transferring, holding, and processing immense amounts of data. Datacenters can include a large quantity of network, storage, and compute devices in various rack-mounted and high-density storage configurations. As datacenters continue to grow and fill, there is an increasing need to utilize datacenter space more efficiently.

A computing rack (sometimes known and referred to as a "server rack", whether or not it contains a server) is a common piece of equipment used to store datacenter equipment, typically when multiple computing units are required. A server is a computing device that provides functionality within in a network for other clients including programs or devices. Servers typically carry out tasks specific to the server including print services, file services, network services, database services, and the like. Servers are often stored in server racks, which may be located in a variety of settings including datacenters and information technology (IT) rooms. However, servers and server racks might also be housed in locations where only a single rack is necessary for providing the necessary services.

Modern computing racks have been trending towards larger and heavier designs in an effort to accommodate more equipment and fewer shipments. In addition, the computing racks are typically transported in one piece, regardless of whether equipment is included inside during transport. However, servers and other datacenter equipment are manufactured by a large variety of manufacturers causing the equipment to vary greatly in size and weight. Thus, a computing rack designed to accommodate computing equipment from one manufacturer is often not able to accommodate equipment from another manufacturer, causing an excess of unused space in computing racks and the need for multiple full-sized racks just to house a few pieces of equipment from different manufacturers.

BRIEF SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various embodiments herein relate to systems and means for storing datacenter equipment. In certain embodiments, a computing rack comprises a frame having an enclosure for storing a plurality of computing units. The computing rack also includes one or more adjustable vertical mounting rails coupled to the frame. The adjustable vertical mounting rails can be adjusted for mounting at least one computing unit. By adjusting the positions of the vertical mounting rails along the depth of the enclosure, the computing rack can accommodate different sizes of computing equipment. The computing rack additionally includes components for stacking the unit with additional computing racks.

In some embodiments, a first computing rack may be stacked on top a chassis and additional computing racks may be stacked on top of the first computing rack. In this manner, adjustable vertical mounting rails of each computing rack in the stack of computing racks can be adjusted to various positions such that each enclosure fits different equipment. The adjustable mounting rails may be used to mount one or more rail kits, wherein computing equipment is supported by each rail kit. In an exemplary embodiment, a computing rack includes four adjustable mounting rails where two of the adjustable mounting rails are used to mount a front of the rail kit and two are used to mount a back.

In certain embodiments, in order to stack multiple computing racks, each computing rack includes a set of insertable components ("feet") and a set of receiving components ("openings"). The feet of one computing rack may be inserted in the openings of another computing rack to securely stack them. In an exemplary embodiment, the feet and openings are used to stack a plurality of computing racks. The adjustable mounting rails of each computing rack may then be adjusted such that each computing rack fits a different size or specification of computing equipment or rail kits.

BRIEF DESCRIPTION OF THE DRAWINGS

Many aspects of the disclosure can be better understood with reference to the following drawings. The components in the drawings are not necessarily drawn to scale. While several implementations are described in connection with these drawings, the disclosure is not limited to the implementations disclosed herein. On the contrary, the intent is to cover all alternatives, modifications, and equivalents.

FIG. 4 illustrates an example of a single computing rack in accordance with some embodiments of the present technology;

FIG. 6 illustrates an example of a single computing rack including additional components such as panes and doors in accordance with some embodiments of the present technology;

FIG. 9 illustrates an example of a frame coupled to a set of adjustable mounting rails in accordance with some embodiments of the present technology;

DETAILED DESCRIPTION

Figure 1:
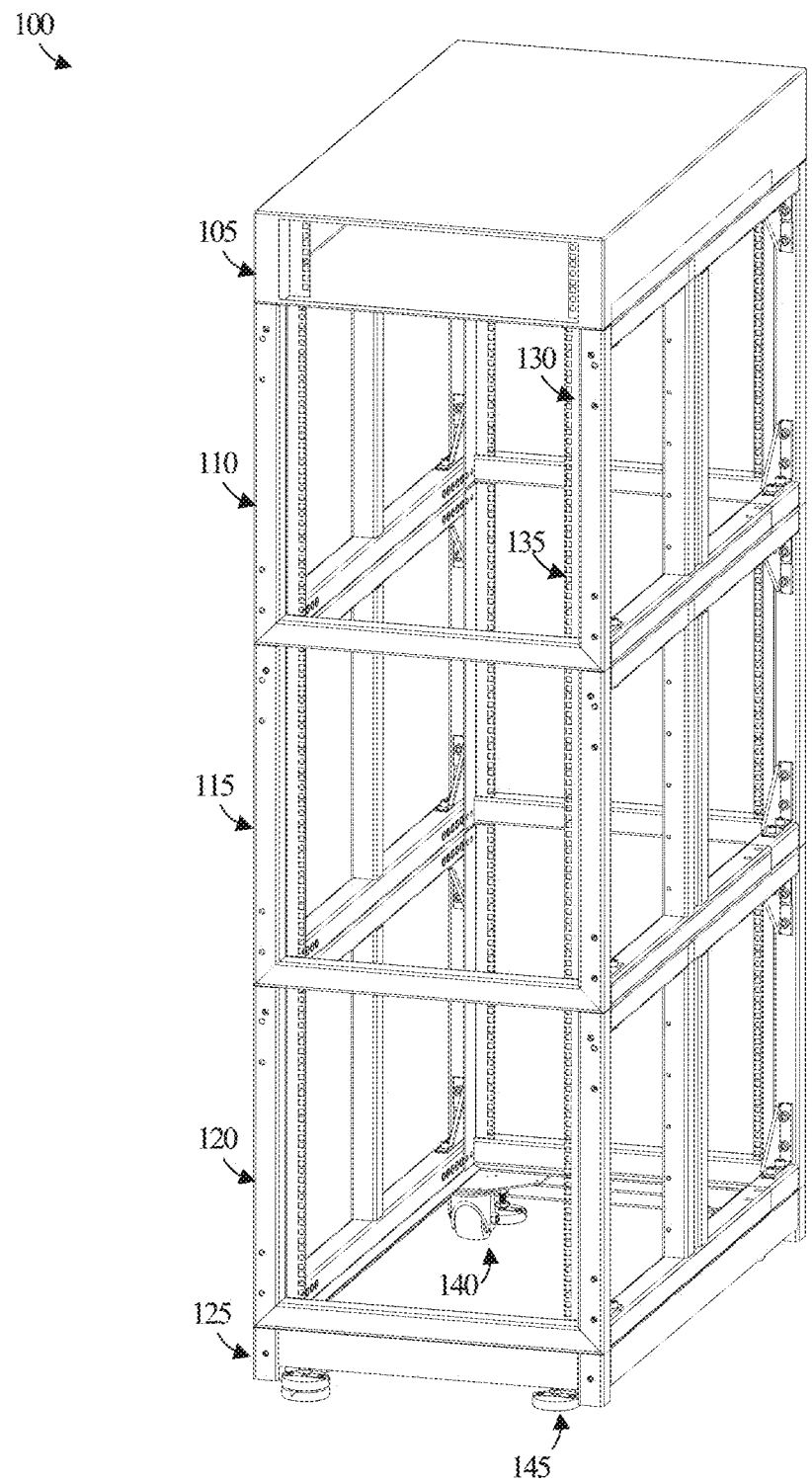
FIG. 1 illustrates an example of several stacked computing racks in accordance with some embodiments of the present technology.

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

The embodiments described herein are not limited in their application to the details of construction and the arrangement of components set forth in the following description or illustrated in the following drawings. Embodiments may be practiced or carried out in various ways. Additionally, the phraseology and terminology used herein is for the purpose of description and should not be regarded as limiting. The use of "including," "comprising," or "having" and variations thereof is meant to encompass the items listed thereafter and equivalents thereof as well as additional items. The terms "rack," "computing rack," "server rack," and "datacenter rack" may be used interchangeably and are herein considered to generally refer to a rack capable of housing a variety of computing equipment. The terms "connected" and "coupled" are used broadly and encompass both direct and indirect mounting, connecting, and coupling. Furthermore, the terms "front," "back," "left," "right," and the like are only for the purposes of explanation and referencing the figures. "Front," "back," and "rear" may refer to the "hot aisle" or "cold aisle" side in different situations and embodiments. Additionally, "left" and "right" may refer to either one of the opposing sides in various contexts and embodiments.

"Cold aisle side" is dependent on the arrangement of the computing units installed into a computing rack and refers to the side with cold air. Likewise, "hot aisle side" is dependent on the arrangements of the computing units and refers to the side with hot air. Datacenters often use either hot aisle containment or cold aisle containment approaches to allow the flow of air through computing racks and prevent overheating. Thus, terms such as "front" and "back" may be relative to a user's specific arrangement and installation practices.

Modern computing racks (sometimes known and referred to as "server racks", whether or not they contain servers) are becoming larger and heavier in an effort to accommodate more equipment and require fewer shipments. In addition, computing racks are sometimes shipped with network, storage, and compute equipment pre-loaded into the rack. Shipping fully loaded datacenter rack systems creates inherent risk from both financial and safety standpoints. Modern datacenters follow standards (e.g. EIA-310-D) that are decades old—loosely defining racks, dimensions, and available mounting points. Due to the many undefined details and specifications in the computing rack industry, racks and computing equipment vary greatly. Pushing the limits of rack specifications in size, weight, material, and other factors have caused issues to arise. Shipping heavy racks (i.e., 3,000 lbs.) and transporting heavy racks into datacenters frequently causes damage to expensive equipment. Furthermore, full-sized empty racks take up valuable shipping space.

To minimize damage to racks and rack components, rack companies have trended towards increasing the strength and construction of modern computing racks by adding thicker materials and support members. Adding thicker materials, however, increases the overall weight of the rack and increases the loads applied to the mounted equipment.

Datacenter racks are frequently manufactured and shipped as a single large component, often with network, storage, and compute equipment pre-loaded into them. However, the large, heavy units can be difficult to transport, often causing damage during transport and other safety concerns. As a result, manufacturers have trended towards thicker, heavier materials to avoid damage, thereby producing even more difficultly and safety concerns. Furthermore, manufacturing computing racks as single, large units has other drawbacks including having leftover, unnecessary space in the rack and only accommodating one size of equipment in the entire rack.

The present technology includes systems and means for manufacturing, transporting, and assembling individual computing rack components according to the specific needs of a user. The computing rack lowers the risk associated with shipping racks, is easier to implement, easier to assemble, and has the flexibility to house a large variety of devices including servers, power distribution units, switches, disc arrays, just a bunch of disks (JBODs), and other computing units developed by different manufacturers and according to different specifications. In some embodiments of the present technology, a single modular computing rack is may be used to mount a specific size of computing equipment. Servers and other computing equipment are usually mounted on rail kits. Rail kits are physically coupled to mounting rails of the computing rack and used to support at least one computing unit. Furthermore, the present technology allows for the single computing rack to be stacked and coupled with additional computing racks via sets of insertable and receiving components. Furthermore, each of the stackable, modular computing racks may include at least one adjustable mounting rail. In an exemplary embodiment, each computing rack includes four adjustable mounting rails—two near the front of the computing rack and two near the back. With these adjustable mounting rails, the front and back of a computing unit, rail kit, or both, may be mounted in the computing rack on both the left and right side.

In some embodiments, the present technology includes a computing rack having a frame with a first enclosure configured to house a plurality of computing units, at least one adjustable vertical mounting rail, and one or more components for stacking the computing rack with at least a second computing rack, the second computing rack having a second enclosure. The enclosure of the first computing rack has a height, a width, and a depth. The at least one adjustable vertical mounting rail is coupled to the frame and is used for mounting the plurality of computing units. The at least one adjustable mounting rail is adjustable to at least a first position along the depth of the first enclosure.

The second computing rack may also have at least one additional adjustable vertical mounting rail that is adjustable to at least a second position along the depth of the second enclosure. The adjustable mounting rail of the computing rack and the additional adjustable vertical mounting rail of the second computing rack are adjustable to different positions such that the second computing rack is configurable to house computing units of a different depth than that of the computing rack.

The computing rack of the present examples comprises a set of insertable components and a set of receiving components. The receiving components are shaped to fit the insertable components of the second computing rack, such that the second computing rack can be stacked on top of the computing rack. The computing rack may be stacked on top of a base or chassis below the computing rack. Furthermore, the computing rack includes at least a set of fasteners by which the frame may be assembled and dissembled for shipping and transport.

In another embodiment, a computing rack has a first stackable cabinet and a second stackable cabinet that is stacked on top of the first stackable cabinet. Both the first and second stackable cabinets of the present embodiment include a frame housing at least one computing unit, a first set of adjustable vertical rails that serve as a front attachment point for mounting the at least one computing unit, a second set of adjustable vertical rails that serve as a rear attachment point for mounting the at least one computing unit, and a set of stacking components for stacking the frame with the frame of another stackable cabinet. In an exemplary embodiment, the first set of adjustable rails of the first stackable cabinet is positioned differently than the first set of adjustable rails of the second stackable cabinet. Similarly, the second set of adjustable rails of the first stackable cabinet may be positioned differently than the second set of adjustable rails of the second stackable cabinet. In this manner, the first and second stackable cabinets can house computing units of a different depth.

In yet another embodiment, a datacenter rack comprises a means for stacking a first computing rack on top of a second computing rack, a means for adjusting a position of at least one mounting rail of the first computing rack, and a means for adjusting a position of at least one mounting rail of the second computing rack. In an exemplary embodiment, the position of the at least one mounting rail of the second computing rack differs from the position of the at least one mounting rail of the first computing rack. The datacenter rack also includes a means for inserting component of the first computing rack into components of the second computing rack. In some examples, the datacenter rack further includes a means for stacking the second computing rack on top of a chassis or base below the second computing rack.

FIG. 1 illustrates an embodiment of the present invention in which three modular computing racks (also referred to as "blocks") are stacked to form one larger datacenter rack, datacenter rack 100. Datacenter rack 100 is comprised of switch rack 105, rack 110, rack 115, rack 120, and base 125. In the present example, rack 120 is stacked on top of base 125. Base 125 may be a rolling base, a stationary base, chassis, or any other rack base suitable for mounting a rack in accordance with the present disclosure. Furthermore, rack 115 is stacked on top of 120, rack 110, is stacked on top of 115, and switch rack 105 is stacked on top of rack 110. Each of the blocks (rack 110, rack 115, and rack 120) have an enclosure having a height, a width, and a depth.

The present example demonstrates three computing racks stacked to form datacenter rack 100. However, any reasonable number of racks may be stacked to create a datacenter rack according to a user or facility's needs. In some cases, a computing room may only require a single computing rack. The computing blocks described provide an advantage over previous systems because of significantly reduced shipping and transportation expenses. When a user only needs to mount a few computing modules, it is wasteful to require a typical (i.e., 42U-size) rack cabinet, as a significant portion of the rack remains empty. Shipping full-sized racks is not cost effective and increases chances of damage as well as safety concerns. On the contrary, a user may need to mount more equipment than would fit in a typical, 42U, rack, but not enough to warrant an additional full-size rack cabinet. The present technology would enable far more flexibility in height and number when filling a computing rack than previous systems, without compromising strength and stability. The modular stacking of blocks also enables easier replacement of blocks when necessary. Furthermore, blocks may be configured to maintain cold aisle and hot aisle separation via air blocking within the blocks.

In some embodiments, switch rack 105 is stackable in the same manner as rack 110, rack 115, and rack 120. Switch rack 105 may comprise insertable components similar to or matching the insertable components of rack 110, rack 115, or rack 120. Switch rack 105 may comprise any top of rack architecture comprising switch-to-server connections. Other switch-to-server connections are possible and anticipated, rendering switch rack 105 optional regarding the present technology. For example, switch-to-server connections may not be mounted within the datacenter rack at all, or may be mounted within one of multiple of the blocks (rack 110, rack 115, or rack 120).

Base 125, in the present example, includes rollers 140 and feet 145. Base 125 is an optional component, but commonly used in datacenter rack architecture. Additionally, base 125 may comprise only feet 145, only rollers 140, or neither. In an exemplary embodiment base 125 comprises receiving components for stacking rack 110, rack 115, or rack 120 on top of it. The receiving components may couple to stackable racks in the same or similar manner that racks stack on top of one another (i.e., fitting insertable components into receiving components).

Each of rack 110, rack 115, and rack 120 comprise four adjustable mounting rails. Rack 110 comprises adjustable mounting rail 130. Adjustable mounting rail 130 may be used to mount the front right part of a rail kit or computing unit. Adjustable mounting rail 130 includes equipment mounting points 135 along the vertical length of the rail. In some embodiments, equipment mounting points 135 are a series of mounting holes positioned at the standard distance (i.e., 0.625 inches). In other examples, equipment mounting points 135 may be a single, long, vertical hole for mounting at any desired position along the height of rack 110. Equipment mounting points 135 may vary according to a user's needs and many different sizes and arrangements are anticipated. For example, some equipment manufacturers use wider and taller units than an Electronic Industries Association (EIA) standard unit, known as a "U." Thus, the equipment from these different manufacturers cannot be housed in a standard rack and cannot be housed in the same rack as equipment from other manufacturers. Thus, the present technology allows each block of a rack to be constructed according the needs of each individual block, where each block may be built according to a different set of standards and specifications.

The position of adjustable mounting rail 130 can be adjusted horizontally along the depth of rack 110. Each of rack 110's four adjustable mounting rails can be repositioned along the depth of rack 110's enclosure allowing for a variety of equipment to be mounted in rack 110. In an exemplary embodiment, rack 110 has its adjustable mounting rails positioned to fit a first specific size of equipment, rack 115's adjustable mounting rails are positioned to fit a second specific size of equipment, and rack 120's adjustable mounting rails are positioned to fit a third specific size of equipment, where the first, second, and third specific sizes are all different. However, in some embodiments, all three racks may be adjusted to fit the same size of equipment or any combination of the racks may fit the same size equipment, extending to any number of racks that may be stacked to form a datacenter rack.

In certain embodiments, rack 110, rack 115, and rack 120 are different heights, or a combination of different heights. For example, rack 110 may be a 12U-size rack, rack 115 a 15U-size rack, and 120 a 20U-size rack. In other examples, all three blocks (rack 110, rack 115, and rack 120) may be 12U, or another size. In some cases, any of the blocks shown may be as small as 1U, 2U, or 3U. However, none of rack 110, rack 115, or rack 120 are a 42U or 48U rack, as they are intended to be small enough to be stacked with minimal effort or equipment. Additionally, the other dimensions of each block may differ including the width and depth of each block's enclosure, or the height, width, or depth of the block itself.

Figure 2B:
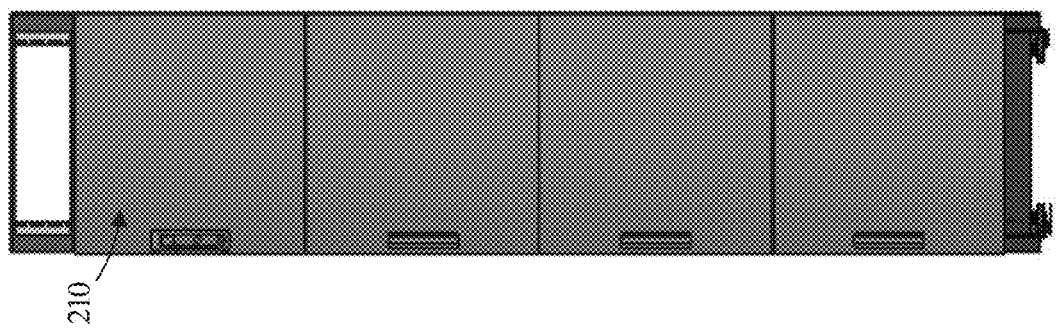
FIGS. 2A and 2B illustrate exemplary examples of stacked computing racks in accordance with some embodiments of the present technology.
Figure 2A:
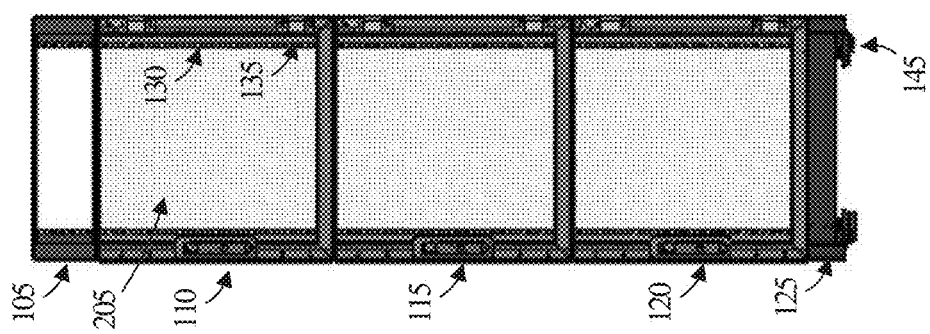

FIGS. 2A and 2B demonstrate two embodiments of stacked datacenter racks in accordance with the present disclosure. Racks comprised in a datacenter rack may include any combination of walls, doors, bottoms, tops, siding, or the like. For example, FIG. 2A shows a rack similar to that of datacenter rack 100, but each of blocks (rack 110, rack 115, and rack 120) include a mesh backing. Backing or rear panels may be necessary according to the requirements of a specific user. In some embodiments, some combination of racks in the datacenter rack may have siding, while others do not. In additional embodiments, rack 110, rack 115, and rack 120 may include a combination of doors on a front side of each of the racks. For example, rack 110 may comprise mesh front door 205 similar to that of the mesh backing. However, like in the case of FIG. 2B, a rack may comprise a solid front door such as front door 210. In the example of FIG. 2B, four racks are stacked to create a datacenter rack, and each of the four racks includes a latching front door. However, any combination of the racks in the present example may comprise any combination of a front door, rear panel, or side panels. In addition, front door 210 may be latching or non-latching, solid or non-solid (e.g., mesh), locking or non-locking, and similar options applicable to a server rack door.

Figure 3:
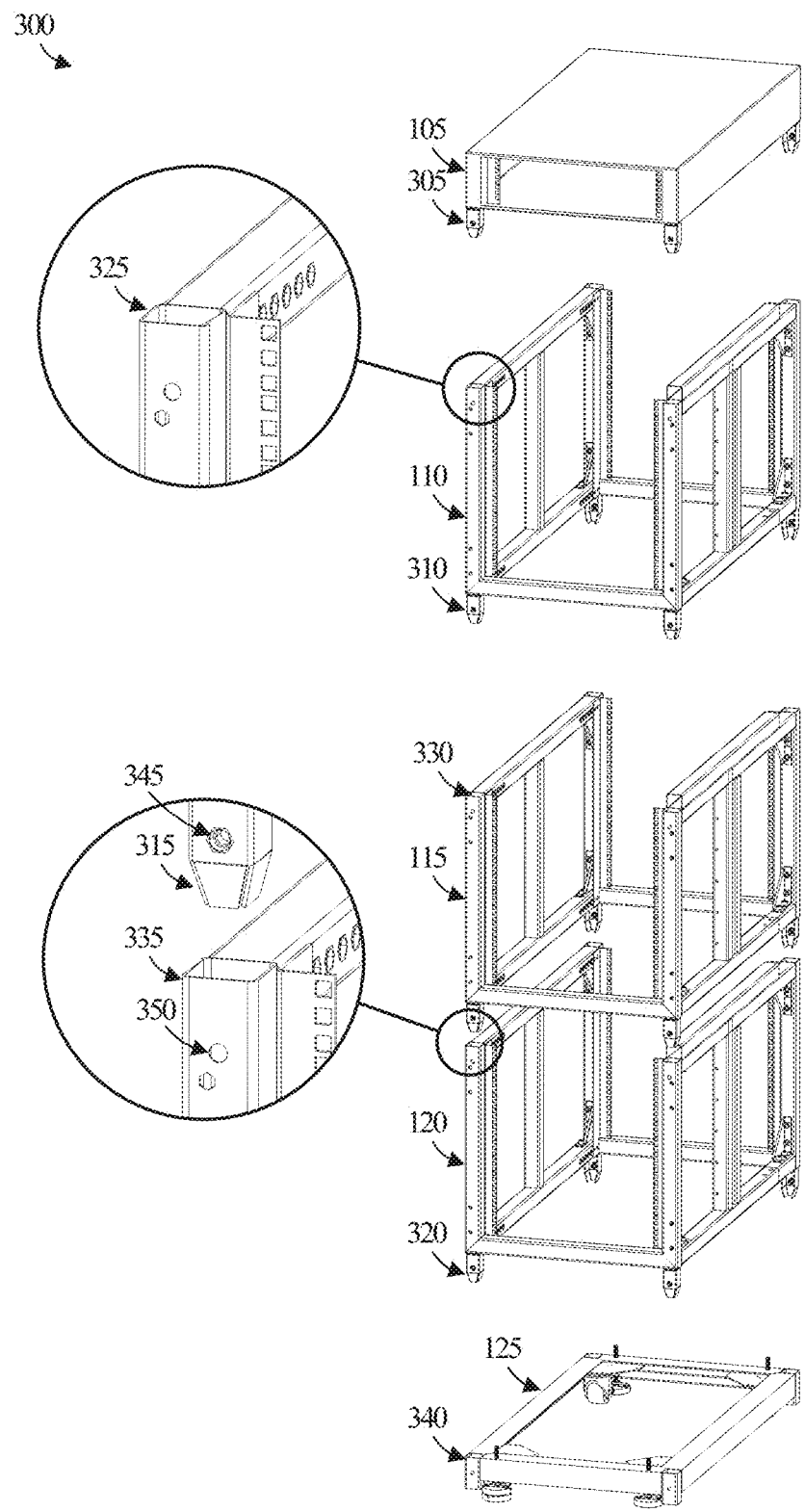
FIG. 3 illustrates stacking features of several stacked computing racks in accordance with some embodiments of the present technology.

FIG. 3 illustrates an example of a datacenter rack assembly. Assembly 300 comprises switch rack 105, rack 110, rack 115, rack 120, and base 125. Each of the racks include insertable components such as foot 310, foot 315, and foot 320. Switch rack 105 also has insertable components, such as foot 305, in the present example. Each of rack 110, rack 115, and rack 120 have a set of receiving components including receiver 325, receiver 330, and receiver 335. Base 125 also has receiving components illustrated by receiver 340 in the present example. Each of the feet and receivers further include fastening points such as hole 345 and hole 350.

In an exemplary embodiment, foot 310 fits inside and is inserted into receiver 330, securely coupling rack 110 to rack 115. Similarly, foot 315 fits inside receiver 335. Foot 315 may be secured to receiver 335 via hole 345 and hole 350, which fit a set of attachment components in an exemplary embodiment. Attachment components may include any combination of fasteners such as nuts, screws, bolts, anchors, washers, hooks, and eyes. In a preferred embodiment, each of the four insertable components of rack 110 are inserted and fastened into the receiving components of rack 115, securing the blocks together. Furthermore, each of the four insertable components of rack 115 are inserted and fastened into receiving components of rack 120 and each of the four insertable components of rack 120 are inserted and fastened into receiving components of base 125. In other embodiments, the racks are securely stacked solely by the insertable and receiving components, without the need for fasteners.

FIG. 3 demonstrates only one example of coupled racks together in accordance with the present technology. Other methods of vertically stacking and fastening racks together are anticipated. Hole 345 and hole 350 may take different forms according to the mechanism used to stack and fasten the racks together. In some embodiments, the bottom rack may not comprise insertable components, such that it can rest directly on the floor or a base. In other embodiments, a bottom rack may still include insertable components, but the insertable components may be instead used to support the rack directly on the floor or a base, without inserting them into any receiving components. Likewise, a rack on top may not comprise receiving components. In some embodiments a top rack is a computing rack such as rack 110. In other embodiments, a top rack is a switch rack. Alternatively, the receiving and insertable components of rack 110, rack 115, and rack 120 may be switched such that insertable components are on the top of a rack and the receiving components are on the bottom. In the present scenario, when rack 110 is stacked on top of rack 115, the receiving components of rack 110 are aligned with and placed over insertable components of rack 115. The racks may still be fastened together in a similar manner to that previously discussed, or not fastened.

Furthermore, in some embodiments, only a single rack is used and may stand alone. When only a single rack is used, it may or may not comprise receiving components or insertable components. In some scenarios, a single rack may comprise insertable components without receiving components such that it can be stacked on a base, such as base 125. Embodiments using only a single computing rack are further explained with reference to FIG. 4.

FIG. 4 illustrates datacenter rack 400. Datacenter rack 400 comprises a single computing rack, rack 110. Rack 110 may be used alone to house any number of servers or other computing units that fit in rack 110. As is clearly illustrated in FIG. 4, rack 110 comprises foot 305, receiver 325, and adjustable mounting rail 130. Adjustable mounting rail 130 can be positioned at various points along the depth of rack 110. For example, bar 405 may comprise a set of fastening points along the length of it for fastening the adjustable mounting rail at various positions. In an exemplary embodiment, adjustable mounting rail 410 would be positioned along bar 415 such that it is aligned with adjustable mounting rail 130 along the depth of rack 110. Similarly, rack 110 has two additional adjustable mounting rails near the back of rack 110 in some embodiments. However, the second set of adjustable mounting rails may not be required, which will be discussed further with respect to FIGS. 8 and 9.

As previously mentioned, the modularity of the present technology provides significant advantages over previous systems. Rack 110 has the advantage of standing alone when a user's needs don't require a very tall datacenter rack. As shown in by datacenter rack 400, rack 110 may be used to mount any number of computing units that fit within it. However, since the adjustable mounting rails will each be adjusted to a specific position, that position will need to be suitable to each piece of equipment mounted in rack 110. Thus, if computing equipment and rail kits require different mounting specifications, a user has the option to use additional racks, such as in FIG. 1. The flexibility provided by the present technology may decrease shipping and transportation costs significantly, as well as reduce safety concerns associated with moving a typical, full-sized rack.

In a specific embodiment, rack 110 is a 12U rack (53.3 cm or 21 inches tall). Even if a user or facility requires a typical 48U rack (213.4 cm or 84 inches tall) and only a single specification for mounting equipment, the modular computing blocks still provide the advantage that each block may be shipped individually, pre-loaded or empty, and the full datacenter rack can be stacked on-site, avoiding the need to maneuver much larger and heavier racks. In other situations, a user may wish to have a rack delivered unassembled, such that there is no wasted free-space inside during shipping and transportation. The present technology enables a modular computing rack that can be easily assembled or disassembled on site.

Figure 5C:
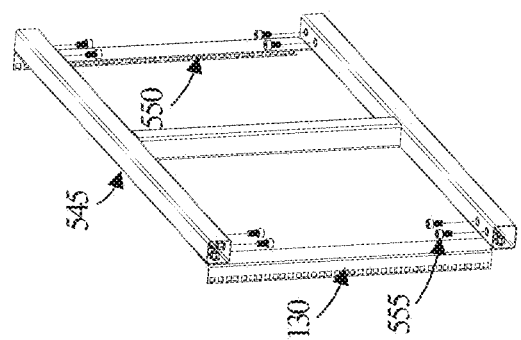
FIGS. 5A, 5B, and 5C illustrate assembly examples for a single computing rack in accordance with some embodiments of the present technology.
Figure 5B:
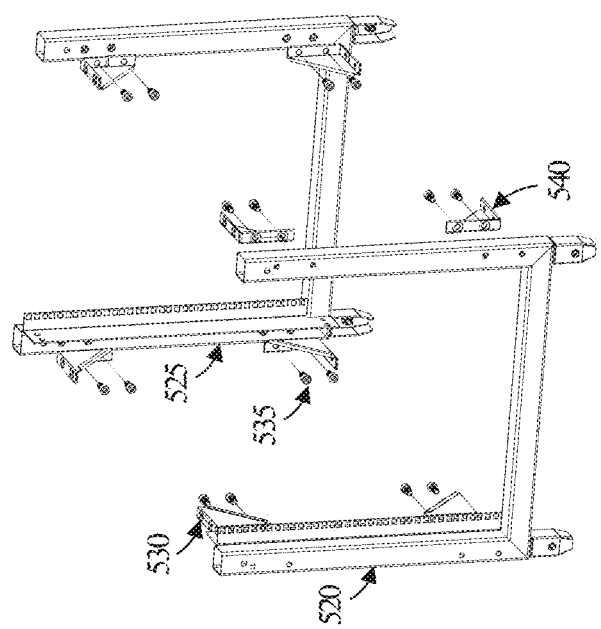
Figure 5A:
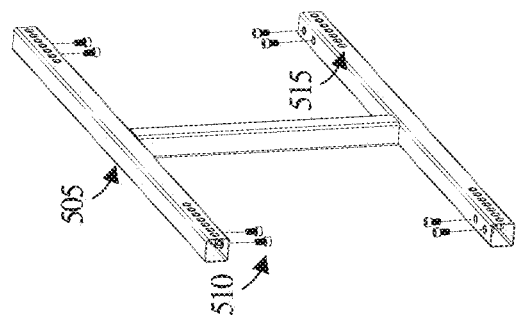

FIGS. 5A, 5B, and 5C illustrate components used to assemble a rack from its original components, as well as unassembled. In the present example, a user or facility may receive the rack unassembled—just the components required to put it together. It may be advantageous to assemble a rack on-site because of the reduced empty space during shipping. Excessive empty space during shipping may make it more difficult to transport and take up valuable room in a transportation vehicle. In some embodiments, the frame of a computing block is comprised of four main components: two "I" pieces and two "U" pieces. FIG. 5A illustrates the left "I" component, "I" component 505. "I" component 505 comprises a series of mounting points in each of its four corners, such as mounting points 515. The components further comprise four sets of bolts, such as bolts 510. Bolts 510 are used to couple "U" component 520 (shown in FIG. 5B) to "I" component 505. "U" component 520 may be coupled to "I" component 510 via corner brace 530 and bolts 510. Additional fastening components may be used when coupling the components together. The other three corners of "I" component 505 may be coupled to "U" component 520 and "U" component 525 in a similar manner. Furthermore, "I" component 545, as shown in FIG. 5C, may be coupled to "U" component 520 and "U" component 525 via corner braces and bolts, such as corner brace 540 and bolts 555. The present embodiment is not restricted to fastening with bolts. In any cases, the bolts of the present example may be replaced by screws or similar fasteners suitable for datacenter rack assembly.

Adjustable mounting rails may each be coupled to one "I" and one "U" component. For example, adjustable mounting rail 130 may be mounted onto "I" component 545. "I" component 545 would have various mounting points for positioning adjustable mounting rail 130. An example of the mounting points is demonstrated by mounting points 515 on "I" component 505. In general, there are four corner braces associated with each rack. Each corner brace can be fastened to a "U" component and an "I" component with four bolts. Adjustable mounting rails may be fastened to the "I" components, such that they can be positioned according to needs along the depth of the rack. In an exemplary embodiment, the adjustable mounting rails are not fastened to the "U" components to maintain their adjustability. The dimensions including height, width, and depth of the "U" components and "I" components of different blocks may vary.

The modularity of the present invention as shown in FIGS. 5A, 5B, and 5C enables facilities that are poorly equipped for transporting large racks in and out of a building to have taller racks than they were previously able to. Facilities may be constrained by low heights of doors into a building, elevator weight restrictions, narrow hallways, and similar size and weight related constraints. Thus, by allowing facilities to transport a datacenter rack in smaller pieces, or unassembled, the places that can be accessed are far less limited.

FIG. 6 illustrates an example of a single rack, rack 110, where rack 110 includes front door 210, rear panel 615, right side panel 605, right side panel 610, left side panel 620, and left side panel 625. Front door 210 is coupled to "U" component 520, rear panel 615 is coupled to "U" component 525, and right side panel 605 and right side panel 610 are coupled to "I" component 545. The doors and panels of rack 110 in FIG. 6 are optional according to the needs of the user. In some examples, rack 110 may stand alone with or without the doors and side panels shown or may have any combination of the doors and panels shown. Rack 110 may also have any combination of doors and side panels shown in FIG. 6. For example, a facility may not want to install rear panel 615 to allow for fans. A facility may have many racks stacked side by side and therefore may only require side panels on the two outmost sides of the series of racks.

In some examples, front door 210 or rear panel 615 may comprise locking mechanisms to provide security for any computing units stored inside the rack. Right side panel 605, right side panel 610, left side panel 620, and left side panel 625 may also include locking mechanisms, may be removable, or may be permanently installed. Furthermore, rack 110 may be stacked with similar computing racks that have the same or a different combination or panels and doors. For example, some racks in a stacked set of racks may require a locking front door, such as front door 210 on rack 110, while others in the stack may not require a door. Similarly, some racks in a stack may require a rear panel, such as rear panel 615, or any combination of side panels, while others do not.

In some embodiments, any combination of front door 210, rear panel 615, right side panel 605, right side panel 610, left side panel 620, or left side panel 625 may comprise a solid metal, a non-solid metal, such as a metal screen, or any similar material suitable for a computing rack.

Figure 7:
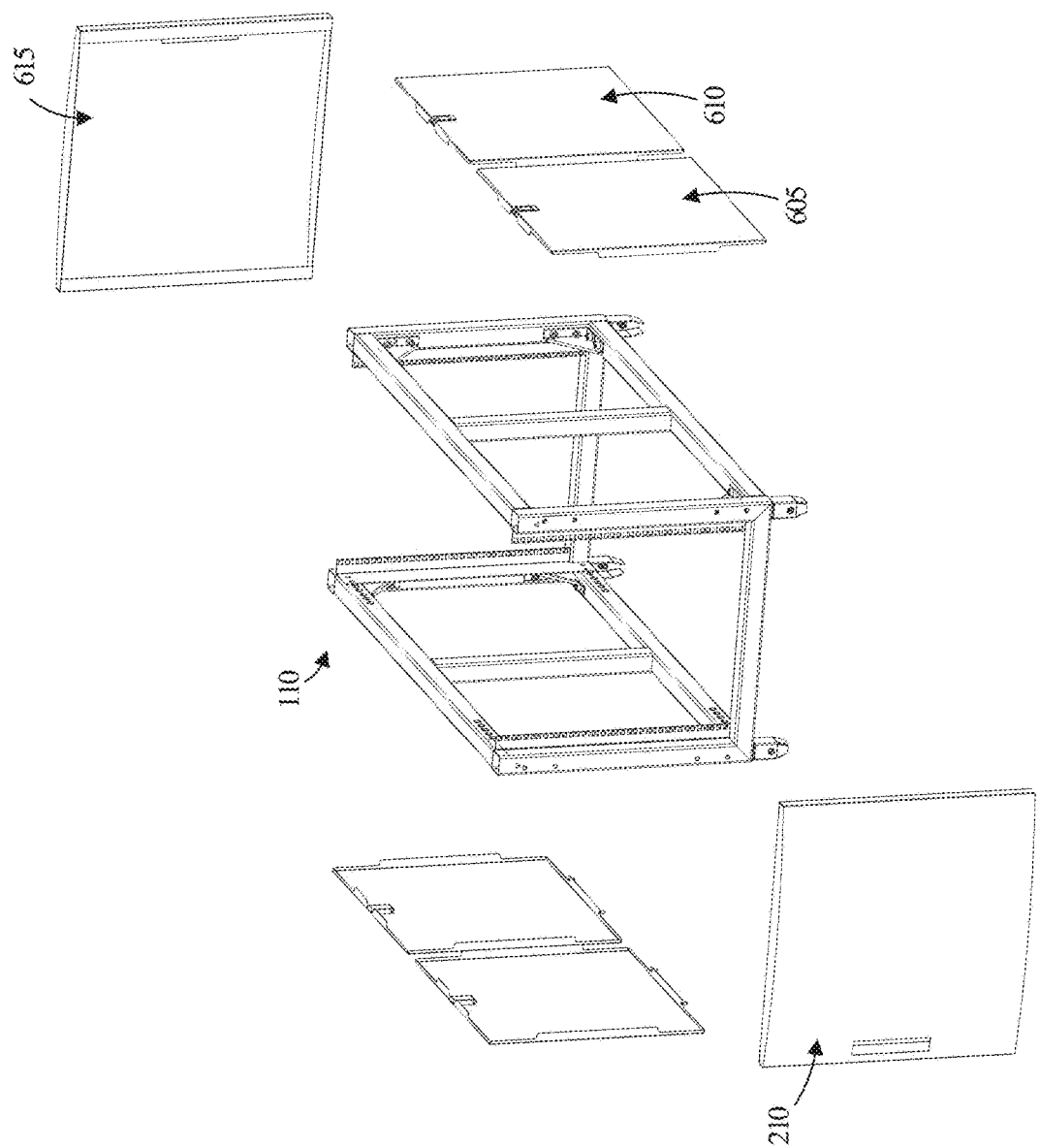
FIG. 7 illustrates an example of the individual components comprising the single computing rack of FIG. 7 in accordance with some embodiments of the present technology.

FIG. 7 further illustrates rack 110 and installable front door 210, rear panel 615, right side panel 605, right side panel 610, left side panel 620, and left side panel 625. As shown in the present example, each of the door and panel components may be separately installable according to a user or facility's needs. Each of the doors and panels may include components for them to be easily coupled to rack 110. These components may be shipped and delivered with rack 110, where rack 110 is shipped and delivered pre-assembled or unassembled as shown in FIGS. 5A-5C. In some examples, front door 210 and any of right side panel 605, right side panel 610, left side panel 620, and left side panel 625 may require fastening to rack 110 via bolts, bolts, and similar fastening devices, or they may couple directly to the rack via various attachment points such that they "snap" into place.

Figure 8:
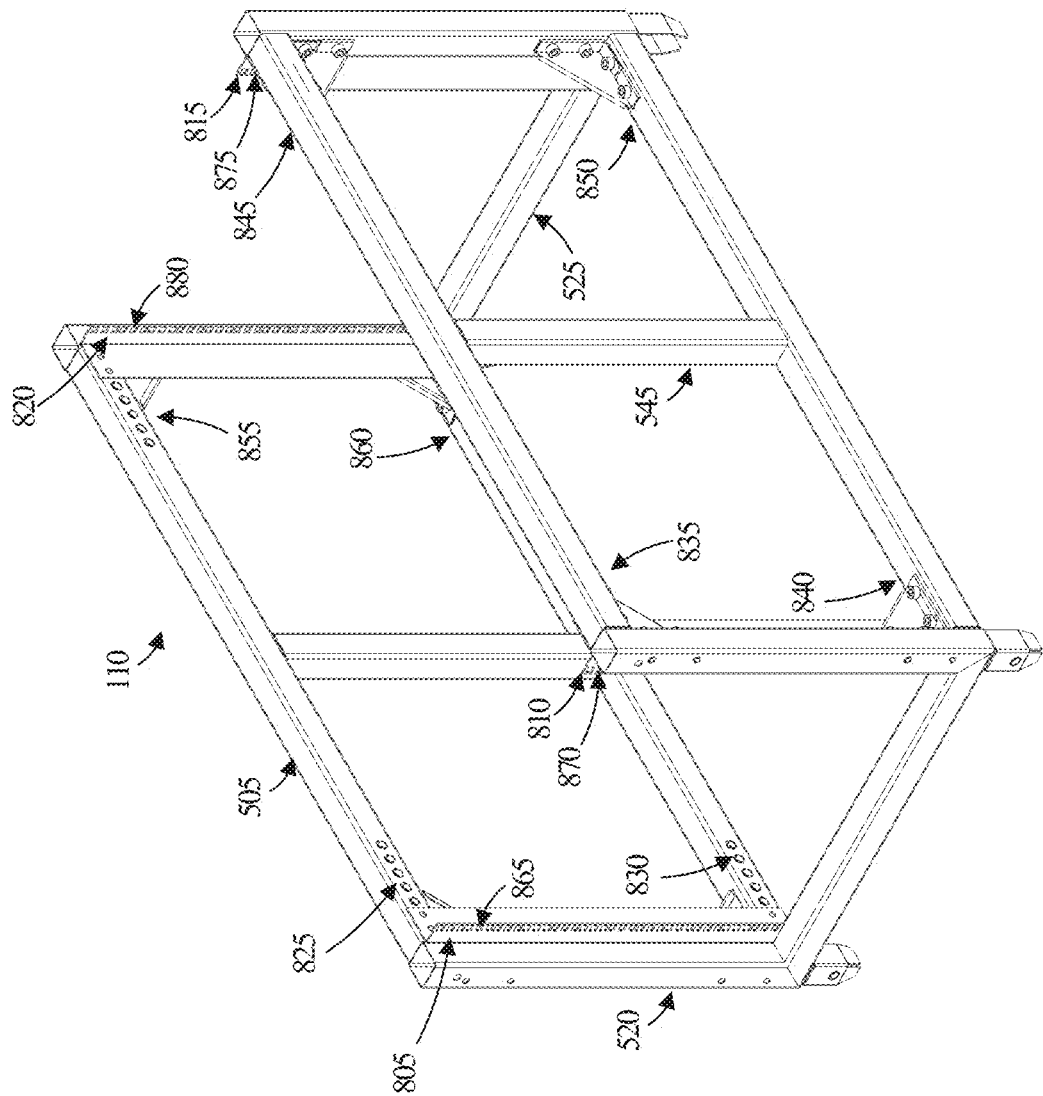
FIG. 8 illustrates an example of a frame coupled to a set of adjustable mounting rails in accordance with some embodiments of the present technology.

FIGS. 8 and 9 serve to demonstrate various functionalities of the adjustable mounting rails of a modular computing block. Starting with FIG. 8, rack 110 includes "I" component 505, "U" component 520, "U" component 525, and "I"

component 545. Rack 110 further includes adjustable mounting rail 805, adjustable mounting rail 810, adjustable mounting rail 815, adjustable mounting rail 820, mounting point 825, mounting point 830, mounting point 835, mounting point 840, mounting point 845, mounting point 850, mounting point 855, and mounting point 860. In the present example, each of the adjustable mounting rails attach to their respective "I" components (i.e., adjustable mounting rail 805 and adjustable mounting rail 820 are coupled to "I" component 505, adjustable mounting rail 810 and adjustable mounting rail 815 are coupled to "I" component 545). In the present example, each adjustable mounting rail comprises four holes for fastening it to an "I" component, where two are located at the top of the bar and two at the bottom, as demonstrated in FIG. 8. No adjustable mounting rails are fastened to a "U" component in the present example to allow for horizontal adjustment along the depth of rack 110. "I" component 505 comprises 28 mounting holes, with 7 mounting holes at each mounting point. Adjustable mounting rail 805 may be fastened to any of the mounting holes in mounting point 825 and subsequently fastened to the corresponding holes of mounting point 830. Likewise, adjustable mounting rail 805 may be fastened to the corresponding mounting holes of mounting point 835 and mounting point 840. Once adjustable mounting rail 805 and adjustable mounting rail 810 have been fastened to their respective mounting points, they may be used to mount a front of at least one computing unit or rail kit.

Adjustable mounting rail 805 and adjustable mounting rail 810 may be fastened farther forward or backward, depending on the size and specifications of equipment to be mounted. Furthermore, adjustable mounting rail 815 and adjustable mounting rail 820 may also be adjusted by positioning them farther forward or backward and fastening them in a similar manner to their respective mounting points. By positioning each of the adjustable mounting rails, many various sizes and specifications can be mounted in rack 110.

Each of the adjustable mounting rails comprise equipment mounting points. Adjustable mounting rail 805, adjustable mounting rail 810, adjustable mounting rail 815, and adjustable mounting rail 820 comprise equipment mounting points 865, equipment mounting points 870, equipment mounting points 875, and equipment mounting points 880, respectively. Various pieces of equipment can be mounted to the equipment mounting points. In some examples, at least one rail kit may be mounted to the equipment mounting points, and computing equipment, such as a server, may be supported by the rail kit. In other examples, computing equipment may mount directly or indirectly to the adjustable mounting rails using the equipment mounting points. Computing equipment may be fastened to any of the equipment mounting points along the height of each adjustable mounting rail 805. Any reasonable number of pieces of computing equipment that fit in rack 110 may be mounted in rack 110 via the equipment mounting points. The equipment mounting points of the present example are not limited to EIA standards, such as the "U," and can be customized according to the needs of a particular facility or user. Various rails kits from different manufacturers may require different mounting specifications, which may be accommodated in accordance with the present example.

In the present example, adjustable mounting rail 805 and adjustable mounting rail 810 are mounted as far forward as their respective mounting points allow. Adjustable mounting rail 815 and adjustable mounting rail 820 are positioned as far backward as their respective mounting points allow. In their present positions, the adjustable mounting rails are set up to fit the largest computing equipment depth that is able to be mounted in rack 110, where the computing equipment may be any general computing device, a server, a rail kit, or any other piece of equipment capable of being mounted in a datacenter rack, and the computing equipment is able to be mounted directly or indirectly to rack 110. At least one piece of computing equipment may then be fastened into rack 110 using equipment mounting points.

In an exemplary embodiment, rack 110 is stacked with a similar computing rack also comprising adjustable mounting rails. The adjustable mounting rails may be positioned to fit a first size of computing equipment, such as at the positions shown in FIG. 8. The adjustable mounting rails of the other computing rack may then be positioned to fit a second size of computing equipment, where the second size is different from the first size. By adjusting the stacked racks to fit different sizes or specifications of computing equipment, a more versatile computing rack can be assembled than previous technology would allow for.

With respect to FIG. 9, rack 110 is shown again, where rack 110 comprises "I" component 505, "I" component 545, "U" component 520, "U" component 525, adjustable mounting rails 805, adjustable mounting rails 810, adjustable mounting rails 815, and adjustable mounting rails 820. However, the adjustable mounting rails are at different positions than in the example of FIG. 8. In the present example, adjustable mounting rail 805 and adjustable mounting rail 810 are positioned as far backward as their respective mounting points allow. Likewise, adjustable mounting rail 815 and adjustable mounting rail 820 are positioned as far forward as their respective mounting points allow. For example, adjustable mounting rail 820 is as far forward on mounting points 855 and mounting points 860 as possible and is as close to adjustable mounting rail 805 as possible. In their present positions, adjustable mounting rails of rack 110 are set up to fit the smallest computing equipment depth that is able to be mounted in the block, where the computing equipment may be any general computing device, a server, a rail kit, or any other piece of equipment capable of being mounted in a datacenter rack. The computing equipment is able to be mounted directly or indirectly to rack 110. At least one piece of computing equipment may then be fastened into rack 110 using the equipment mounting points.

In FIGS. 8 and 9, the "U" and "I" components may take on many different sizes, lengths, heights, or other specifications. A block may be constructed to have an enclosure of greater or lesser depth than an EIA standard rack, may be wider, or may taller. In the present example, if an "I" component of a block is of a certain length, it may be stacked with blocks having "I" components of the same length. However, the height of the "I" and "U" components need not be the same between blocks for a set of blocks to be stacked. Similarly, the width of a block as defined by the width of the "U" components, should be same between blocks in order for to stack the blocks.

The adjustable mounting rails, mounting points, and equipment mounting points of FIGS. 8 and 9, may take on many different embodiments or configurations. In some examples, any or all of the adjustable mounting rails may be shaped differently, may couple to "I" components or computing equipment differently, or take any other form that allows them to perform their functions described in the present disclosure. In some embodiments, rack 110 is a 12U rack. Thereby, its adjustable mounting rails are 12U rails. In other embodiments, rack 110 and its adjustable mounting rails are larger or smaller than 12U. However, in accordance with the present disclosure, rack 110 and its adjustable mounting rails are a reasonably small height allowing them to be stacked with other racks. Likewise, mounting points may take the form of a single fastening hole, several fastening holes, or any other shape or mechanism allowing them to receive fastening components capable of mounting their respective adjustable mounting rails. All components of rack 110 as shown in FIGS. 8 and 9 may take on slightly different forms or physical variations and remain within the scope of the present disclosure.

Figure 10B:
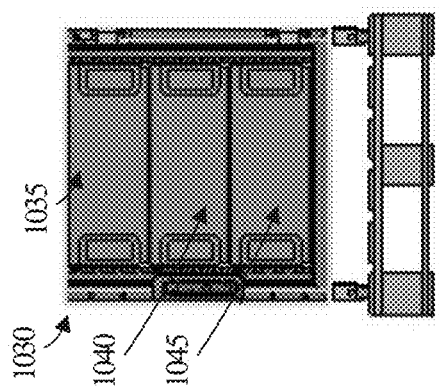
FIGS. 10A and 10B illustrate two examples of how computing racks may be shipped in accordance with some embodiments of the present technology.
Figure 10A:
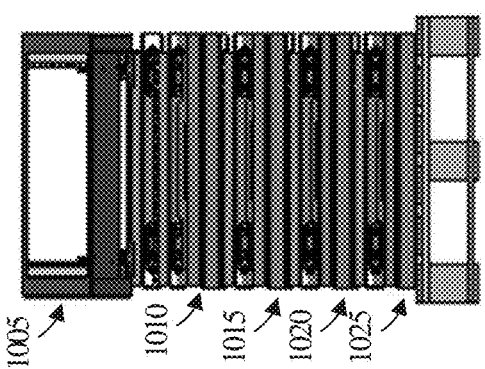

FIGS. 10A and 10B illustrate two examples of manners in which a rack or a set of rack may be shipped in accordance with the present technology. FIG. 10A demonstrates a stack of racks comprising switch rack 1005, rack 1010, rack 1015, rack 1020, and rack 1025, all of which are not yet assembled. As described with respect to FIGS. 5A-5C, the modularity of the disclosed computing block allows for the racks to be easily assembled with a relatively small number of parts. Thus, by shipping a set of racks unassembled as shown in FIG. 10A, significant space can be saved during shipping and transport. A user or facility can then assemble the shipped racks on site, making it easier to get equipment to the desired location.

FIG. 10B illustrates an alternative example in which a single rack is shipped pre-loaded with computing equipment. Rack 1030 is shipped pre-loaded with computing unit 1035, computing unit 1040, and computing unit 1045. In many cases, a user or facility desires a rack to arrive pre-loaded with computing equipment. However, when a typical 48U rack is shipped fully loaded with computing equipment, its weight makes it very difficult and dangerous to transport and increases the likelihood of damage during transport. Therefore, if a user or facility desires a large computing rack full of pre-loaded computing equipment, it is much easier and safer to ship four pre-loaded 12U racks than a single pre-loaded 48U rack. Upon arrival, a user may just need to stack the pre-loaded racks according to their needs, which can be accomplished with a relatively small hydraulic lift or similar lifting device compared to the equipment required to set up a single 48U rack.

Figure 11:
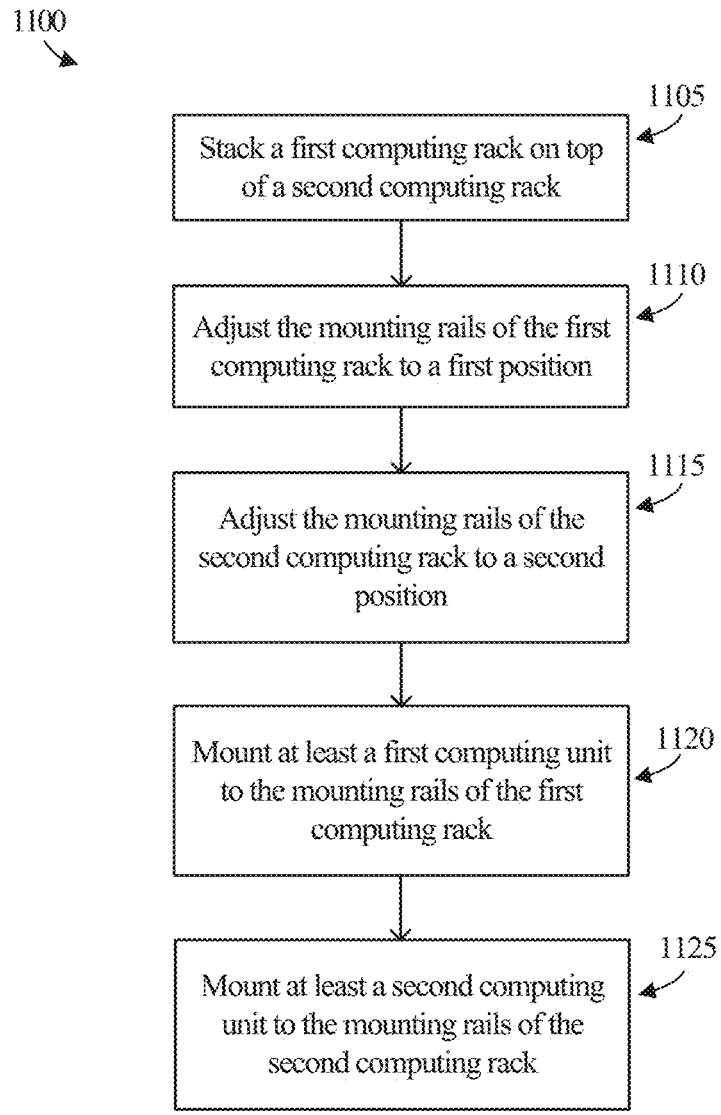
FIG. 11 illustrates a process of assembling a computing rack in accordance with some embodiments of the present technology.

FIG. 11 is a flowchart illustrating a series of steps 1100 in accordance with some embodiments of the present technology. In step 1105, a first computing rack is stacked on top of a second computing rack. The computing racks of the present step may be any of the computing racks illustrated in the previous examples. However, the computing racks of step 1105 require stacking components including at least one set of insertable components and one set of receiving components between the two racks. Stacking the first computing rack on top of the second computing rack therefore involves inserting the insertable components of one of the computing racks into the receiving components of the other computing rack. In step 1110, the mounting rails of the first computing rack are adjusted to a first position. The first position may be any position that the mounting points of the first rack allow for. In some examples, the positions of only two mounting rails are adjusted (the front set or the back set), while in other examples, the positions of all four mounting rails are adjusted. In step 1115, the mounting rails of the second computing rack are adjusted to a second position. Similar to the first rack, the positions of only two mounting rails are adjusted in some situations, while the positions of all four mounting rails are adjusted in other situations.

In step 1120, a first computing unit is mounted to the first computing rack. The first computing unit may be mounted directly or indirectly to the first computing rack. In some examples, a rail kit is directly coupled to the adjustable mounting rails of the first computing rack and the first computing unit is then mounted to or supported by the rail kit. In step 1125, a second computing unit is mounted to the mounting rails of the second computing rack. As with the first computing unit, the second computing unit may be mounted directly or indirectly to the second computing rack. In some examples, a rail kit is directly coupled to the adjustable mounting rails of the second computing rack and the second computing unit is then mounted to or supported by the rail kit.

Steps 1100 may further include mounting additional computing units into one or both of the computing racks. Furthermore, steps 1100 may include stacking additional computing racks above or below the first and second computing racks, where stacking additional racks includes inserting the insertable components of one rack into the receiving components of another rack. Steps 1100 may further include stacking the racks on a base. The base may be a stationary or rolling base. In some examples, a switch top may be stacked on top of the stack of computing racks, forming a complete datacenter rack.

The included descriptions and figures depict specific embodiments to teach those skilled in the art how to make and use the best mode of the invention. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. A computing rack comprising:
   a first frame comprising a first enclosure configured to house a first plurality of computing units, the first enclosure having a height, a width, and a depth;
   at least one first set of adjustable vertical mounting rails, coupled to the first frame, for mounting the first plurality of computing units, wherein the at least one first set of adjustable vertical mounting rails is positioned at a first position along the depth of the first enclosure;
   a second frame comprising a second enclosure configured to house a second plurality of computing units, the second enclosure having a height, a width, and a depth;
   at least one second set of adjustable vertical mounting rails, coupled to the second frame, for mounting the second plurality of computing units, wherein the at least one second set of adjustable vertical mounting rails is positioned at a second position along the depth of the second enclosure, wherein the first position is different from the second position such that the second frame is configurable to house the second plurality of computing units of a different depth than the first plurality of computing units corresponding to the first frame; and
   a plurality of components for vertically stacking and securing the first frame with the second frame, wherein the plurality of components comprises a plurality of receiving components each shaped to receive a corresponding insertable component of a plurality of parallel insertable components each extending vertically from a respective corner of a corresponding stacked frame.

2. The computing rack of claim 1, wherein the at least one first set of adjustable vertical mounting rails coupled to the first frame comprises:
a first set of front adjustable vertical mounting rails for mounting a front of at least one computing unit; and
a second set of back adjustable vertical mounting rails for mounting a back of the at least one computing unit.

3. The computing rack of claim 1, wherein:
the second frame is stacked on top of the first frame; and
one or more of the plurality of insertable components of the second frame are inserted into one or more of the plurality of receiving components of the first frame.

4. The computing rack of claim 3, wherein the second frame is a switch rack.

5. The computing rack of claim 1, wherein the computing rack is stacked on top of a chassis below the computing rack.

6. The computing rack of claim 5, wherein the chassis comprises a set of rollers.

7. The computing rack of claim 1, further comprising at least one rail kit, wherein the rail kit is coupled to the at least one adjustable vertical mounting rail.

8. The computing rack of claim 7, wherein at least one computing unit is supported in the computing rack by the at least one rail kit.

9. The computing rack of claim 1, further comprising a set of fasteners by which each frame may be assembled and unassembled for shipping.

10. The computing rack of claim 1, wherein the first frame comprises:
a first I-shaped piece coupled to a first U-shaped piece via a first pair of corner braces and coupled to a second U-shaped piece via a second pair of corner braces; and
a second I-shaped piece coupled to the first U-shaped piece via a third pair of corner braces and coupled to the second U-shaped piece via a fourth pair of corner braces.

11. The computing rack of claim 10, wherein one of the first set of adjustable vertical mounting rails is coupled to the first I-shaped piece of the first frame and another of the first set of adjustable vertical mounting rails is coupled to the second I-shaped piece of the first frame.

12. The computing rack of claim 11, wherein the first set of adjustable vertical mounting rails is coupled to the first U-shaped piece of the first frame.

13. A rack comprising:
a first stackable cabinet; and
a second stackable cabinet, wherein the second stackable cabinet is stacked on top of the first stackable cabinet;
wherein each of the first and second stackable cabinets comprises:
a frame housing at least one computing unit,
a first set of adjustable vertical rails, wherein the first set of adjustable vertical rails serves as a front attachment point for mounting the at least one computing unit,
a second set of adjustable vertical rails, wherein the second set of adjustable vertical rails serves as a rear attachment point for mounting the at least one computing unit,
wherein the second set of adjustable vertical rails of the first stackable cabinet is at a first position that is different from a second position of the second set of adjustable vertical rails of the second stackable cabinet such that the second stackable cabinet is configurable to house the at least one computing unit of a different depth than the at least one computing unit of the first stackable cabinet, and
a set of stacking components for vertically stacking the frame with a frame of another stackable cabinet, wherein the set of stacking components comprises one or more receiving components each shaped to receive one of a plurality of parallel insertable components each extending vertically from a respective corner of another stackable cabinet.

14. The rack of claim 13, wherein the first set of adjustable vertical rails of the first stackable cabinet is positioned differently than the first set of adjustable vertical rails of the second stackable cabinet.

15. The rack of claim 13, wherein the set of stacking components further comprises one or more insertable components.

16. The rack of claim 15, wherein:
the one or more receiving components of the first stackable cabinet fit insertable components of the second stackable cabinet.

17. A datacenter rack comprising:
a means for vertically stacking a first computing rack on top of a second computing rack, wherein each of the first and second computing racks comprises:
an enclosure comprising a height, a width, and a depth, and
a frame;
a means for adjusting a position of at least one mounting rail of the first computing rack;
a means for adjusting a position of at least one mounting rail of the second computing rack, wherein the position of the at least one mounting rail of the second computing rack is configurable to differ from the position of the at least one mounting rail of the first computing rack to house computing units of a different depth than computing units of the first computing rack; and
a means for inserting each of a plurality of parallel insertable components integral to and extending vertically from a respective corner of the first computing rack into corresponding receiving components integral to the second computing rack.

18. The datacenter rack of claim 17, wherein each of the first computing rack and the second computing rack further comprises a set of mounting rails for mounting a front of a rail kit.

19. The datacenter rack of claim 17, wherein each of the first computing rack and the second computing rack further comprises a set of mounting rails for mounting a back of a rail kit.

20. The datacenter rack of claim 17, further comprising a means for stacking the second computing rack on top of a chassis below the second computing rack.

* * * * *